(12) United States Patent
Tashiro et al.

(10) Patent No.: US 11,776,792 B2
(45) Date of Patent: Oct. 3, 2023

(54) PLASMA PROCESSING APPARATUS AND PLASMA PROCESSING METHOD

(71) Applicant: Hitachi High-Tech Corporation, Tokyo (JP)

(72) Inventors: Shunsuke Tashiro, Tokyo (JP); Takashi Uemura, Tokyo (JP); Shengnan Yu, Tokyo (JP); Yasushi Sonoda, Tokyo (JP); Kiyohiko Sato, Tokyo (JP); Masahiro Nagatani, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/276,714

(22) PCT Filed: Apr. 3, 2020

(86) PCT No.: PCT/JP2020/015292
§ 371 (c)(1),
(2) Date: Mar. 16, 2021

(87) PCT Pub. No.: WO2021/199420
PCT Pub. Date: Oct. 7, 2021

(65) Prior Publication Data
US 2022/0115212 A1     Apr. 14, 2022

(51) Int. Cl.
*H01J 37/32* (2006.01)
*H01L 21/3065* (2006.01)
*H01L 21/311* (2006.01)

(52) U.S. Cl.
CPC ........ *H01J 37/32449* (2013.01); *H01J 37/32* (2013.01); *H01J 37/32834* (2013.01);
(Continued)

(58) Field of Classification Search
None
See application file for complete search history.

(56) References Cited

U.S. PATENT DOCUMENTS 3,760,843 A    9/1973  Larner
4,450,031 A    5/1984  Ono et al.
(Continued)

FOREIGN PATENT DOCUMENTS

CN    109935512 A    6/2019
JP    S6214429 A     1/1987
(Continued)

OTHER PUBLICATIONS

Search Report dated May 26, 2021 in corresponding International Application No. PCT/JP2020/015292.
(Continued)

*Primary Examiner* — Stephanie P Duclair
(74) *Attorney, Agent, or Firm* — MILES & STOCKBRIDGE, P.C.

(57) ABSTRACT

A plasma processing apparatus or a plasma processing method having an improved yield, the plasma processing apparatus includes: a processing chamber arranged inside a vacuum container; a processing gas supply line connecting to the vacuum container, communicating with the processing chamber, and configured to supply processing gas having adhesiveness to the processing chamber; and a gas exhaust line for the processing gas connecting and communicating the processing gas supply line with a processing chamber exhaust line that is connected to an exhaust pump and communicates with the processing chamber, in which the plasma processing apparatus exhausts the processing gas in the processing gas supply line through the gas exhaust line and the processing chamber exhaust line in a state where supplying of the processing gas to the processing chamber is
(Continued)

stopped between one processing step of etching the wafer and a subsequent processing step.

4 Claims, 8 Drawing Sheets

(52) U.S. Cl.
CPC .. *H01L 21/30655* (2013.01); *H01L 21/31116* (2013.01); *H01J 2237/334* (2013.01)

(56) References Cited

U.S. PATENT DOCUMENTS

| | | | |
|---|---|---|---|
| 4,638,837 A | 1/1987 | Buike et al. | |
| 4,669,404 A | 6/1987 | Yoneda | |
| 4,844,767 A | 7/1989 | Okudaira et al. | |
| 4,960,073 A | 10/1990 | Suzuki et al. | |
| 5,284,544 A | 2/1994 | Mizutani et al. | |
| 5,992,460 A | 11/1999 | Akimoto | |
| 5,998,986 A | 12/1999 | Ido | |
| 6,082,406 A | 7/2000 | Williamson, Jr. et al. | |
| 6,145,541 A | 11/2000 | Hirota | |
| 6,162,323 A | 12/2000 | Koshimizu | |
| 6,192,937 B1 | 2/2001 | Fagerlie et al. | |
| 6,287,980 B1 | 9/2001 | Hanazaki et al. | |
| 9,340,879 B2 | 5/2016 | Yahata | |
| 10,121,686 B2 | 11/2018 | Ogawa et al. | |
| 11,355,319 B2 | 6/2022 | Himbele et al. | |
| 2002/0106845 A1 | 8/2002 | Chao et al. | |
| 2003/0212507 A1 | 11/2003 | Wei et al. | |
| 2004/0129671 A1 | 7/2004 | Ji et al. | |
| 2007/0163477 A1 | 7/2007 | Nagata et al. | |
| 2007/0281448 A1* | 12/2007 | Chen | H01L 21/02126 156/345.31 |
| 2008/0078505 A1* | 4/2008 | Kofuji | H01L 21/3065 257/E21.252 |
| 2008/0110400 A1 | 5/2008 | Satou et al. | |
| 2011/0120649 A1 | 5/2011 | Satou et al. | |
| 2012/0064726 A1 | 3/2012 | Nozawa et al. | |
| 2012/0222751 A1 | 9/2012 | Okabe | |
| 2012/0231553 A1 | 9/2012 | Okita et al. | |
| 2012/0255617 A1 | 10/2012 | Miyazoe et al. | |
| 2013/0270625 A1 | 10/2013 | Jang et al. | |
| 2013/0319615 A1 | 12/2013 | Cho et al. | |
| 2014/0057447 A1 | 2/2014 | Yang et al. | |
| 2015/0083582 A1 | 3/2015 | Dhindsa et al. | |
| 2015/0330519 A1 | 11/2015 | Maurer et al. | |
| 2016/0133530 A1 | 5/2016 | Sonoda et al. | |
| 2016/0177443 A1 | 6/2016 | Kumar et al. | |
| 2016/0379857 A1* | 12/2016 | Ogawa | C23C 16/45561 137/587 |
| 2019/0189403 A1 | 6/2019 | Himbele et al. | |

FOREIGN PATENT DOCUMENTS

| | | |
|---|---|---|
| JP | H03218018 A | 9/1991 |
| JP | H04180621 A | 6/1992 |
| JP | H04225226 A | 8/1992 |
| JP | H0507763 A | 1/1993 |
| JP | H05234947 A | 9/1993 |
| JP | H08107101 A | 4/1996 |
| JP | 2000306884 A | 11/2000 |
| JP | 200185342 A | 3/2001 |
| JP | 2001319882 A | 11/2001 |
| JP | 2003229419 A | 8/2003 |
| JP | 2008124190 A | 5/2008 |
| JP | 2009094401 A | 4/2009 |
| JP | 2013251546 A | 12/2013 |
| JP | 201550362 A | 3/2015 |
| JP | 2015065434 A | 4/2015 |
| JP | 2015092637 A | 5/2015 |
| JP | 2016145412 A | 8/2016 |
| JP | 2017-036493 A | 2/2017 |
| JP | 2019110215 A | 7/2019 |
| KR | 20050099723 A | 10/2005 |
| KR | 20080086172 A | 9/2008 |
| KR | 10-1552532 A | 9/2015 |
| KR | 20170101952 A | 9/2017 |
| KR | 20170108916 A | 9/2017 |
| TW | 544805 B | 8/2003 |
| TW | 201234474 A | 8/2012 |
| TW | 201417172 A | 5/2014 |
| TW | M546073 U | 7/2017 |
| TW | 201929614 A | 7/2019 |
| WO | 2005/024926 * | 3/2005 |
| WO | 2005024926 A1 | 3/2005 |
| WO | 2005104203 A1 | 11/2005 |
| WO | 2016121075 A1 | 8/2016 |

OTHER PUBLICATIONS

Office Action dated Dec. 9, 2019 in corresponding Korean Application No. 10-2018-0157894.
Office Action dated Sep. 28, 2018 in corresponding Taiwanese Application No. 106123071.
Office Action dated Mar. 5, 2019 in corresponding Japanese Application No. 2018-037128.
Office Action dated Apr. 29, 2021 in related U.S. Appl. No. 16/216,455.
Office Action dated Jul. 12, 2022 in Taiwanese Application No. 110105884.
Office Action dated Nov. 16, 2022 in Korean Application No. 10-2021-7004483.
Office Action dated Apr. 29, 2023 in Chinese Application No. 202080004559.5.

* cited by examiner

[FIG. 1]
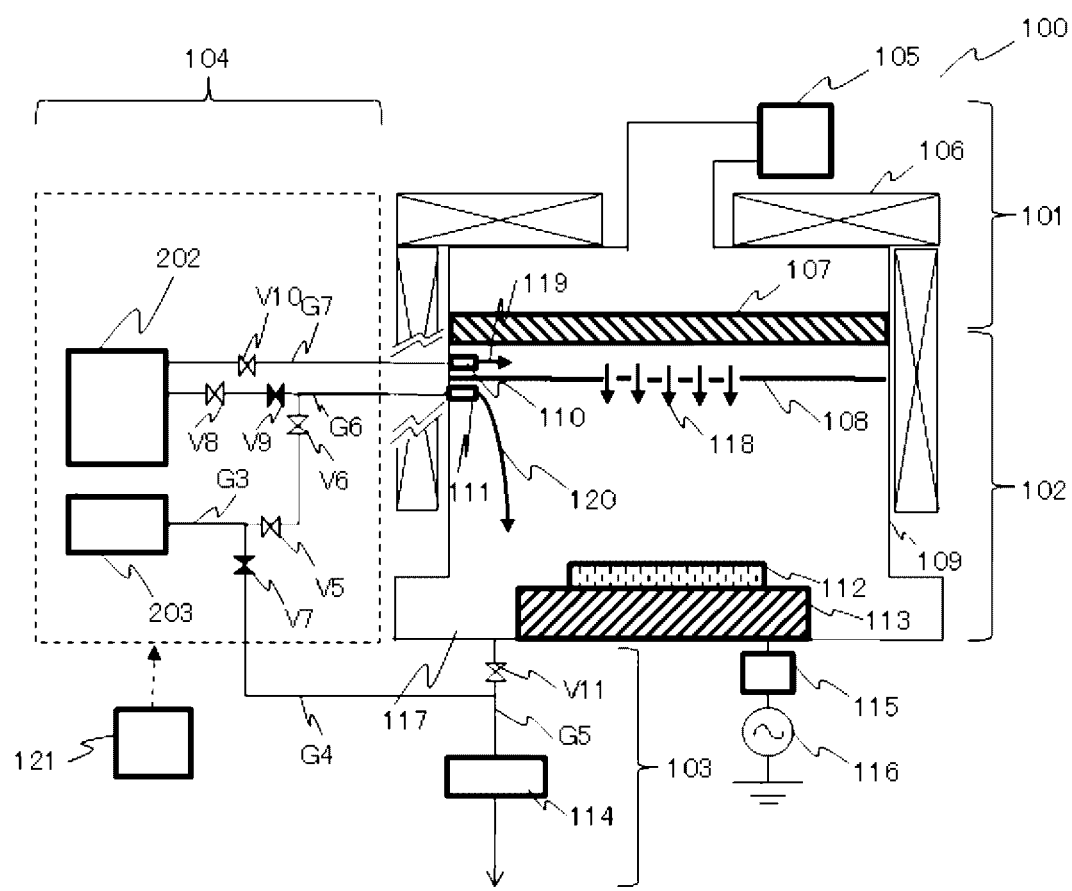

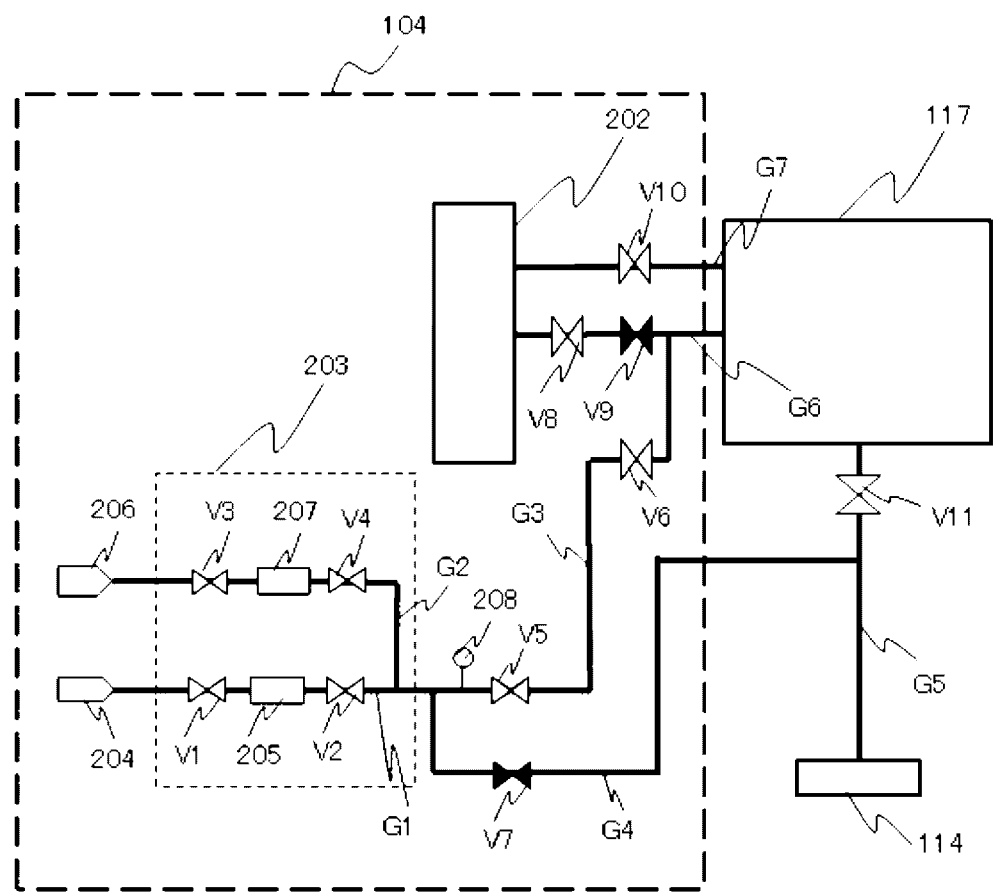
[FIG. 2]

[FIG. 3]
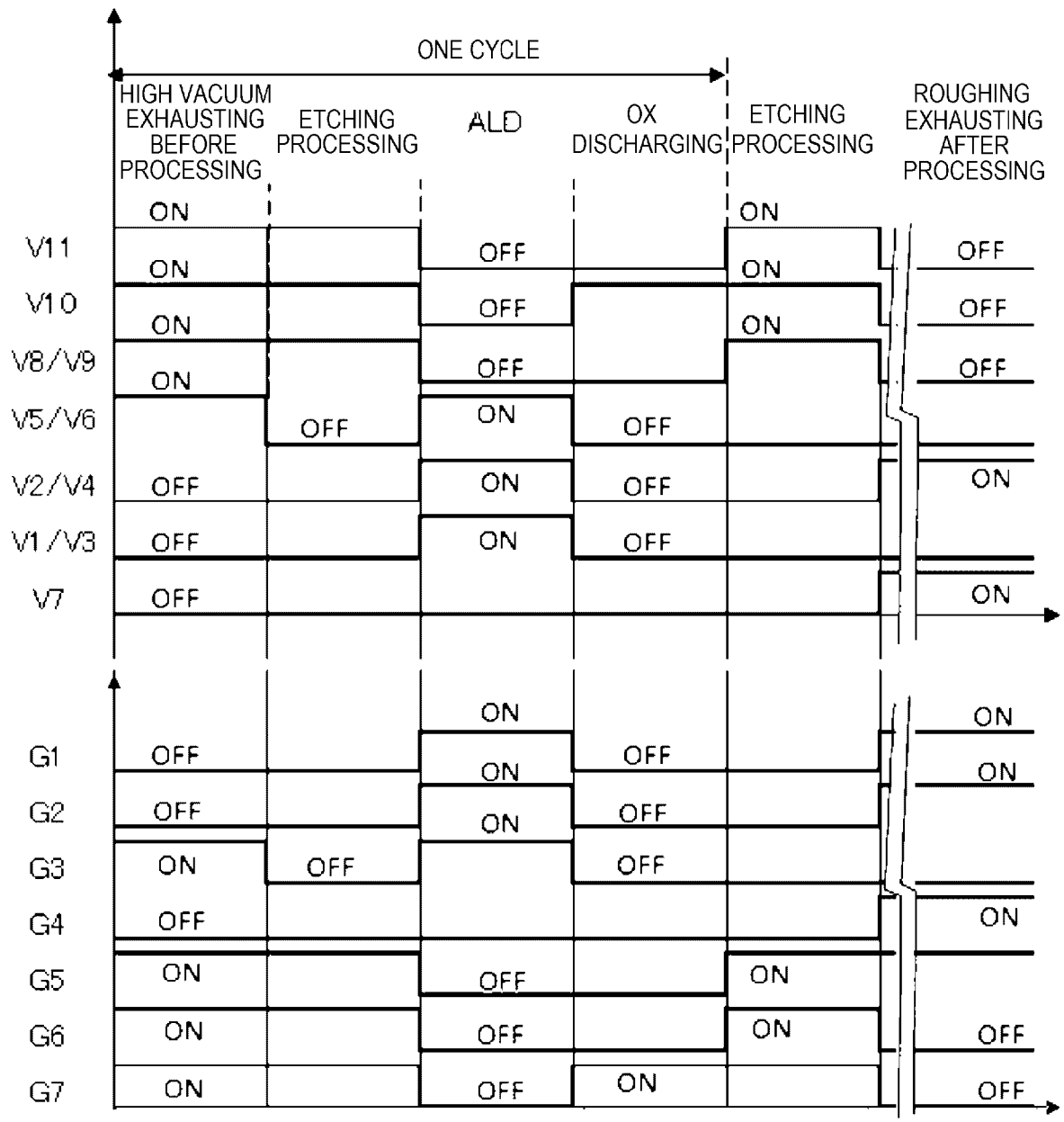

[FIG. 4]
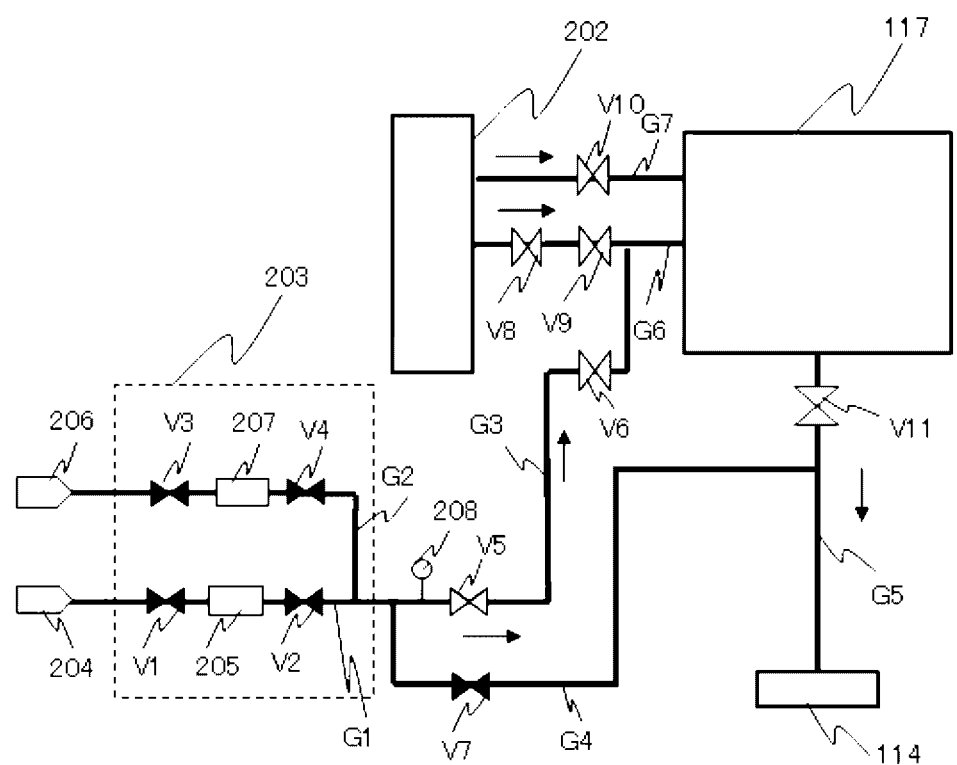

[FIG. 5]
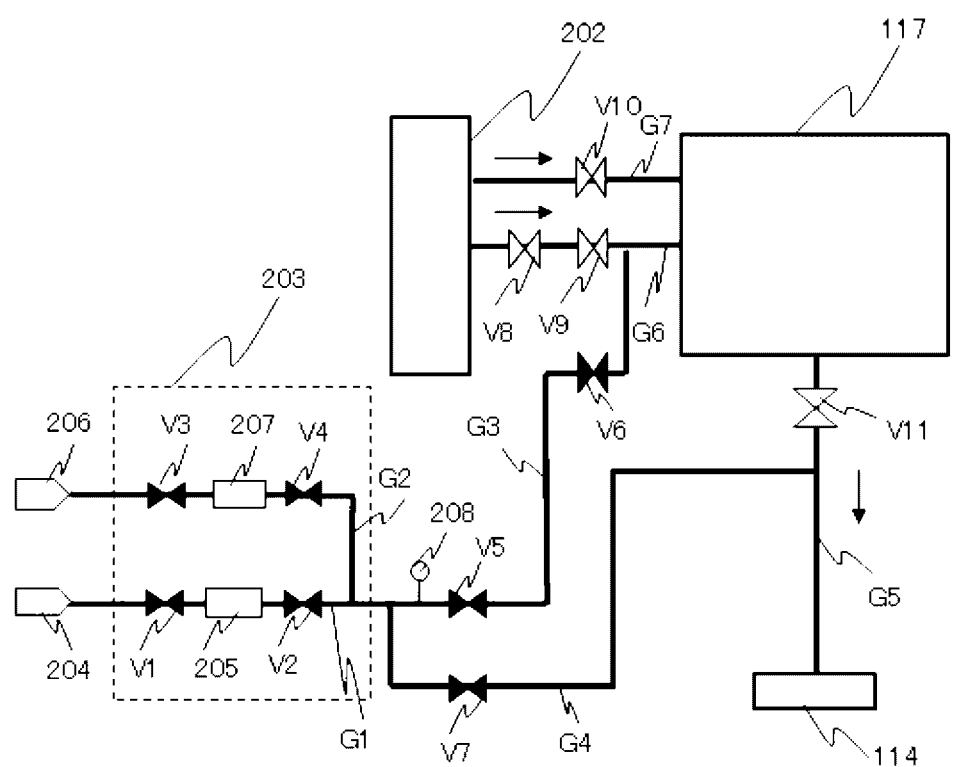

[FIG. 6]
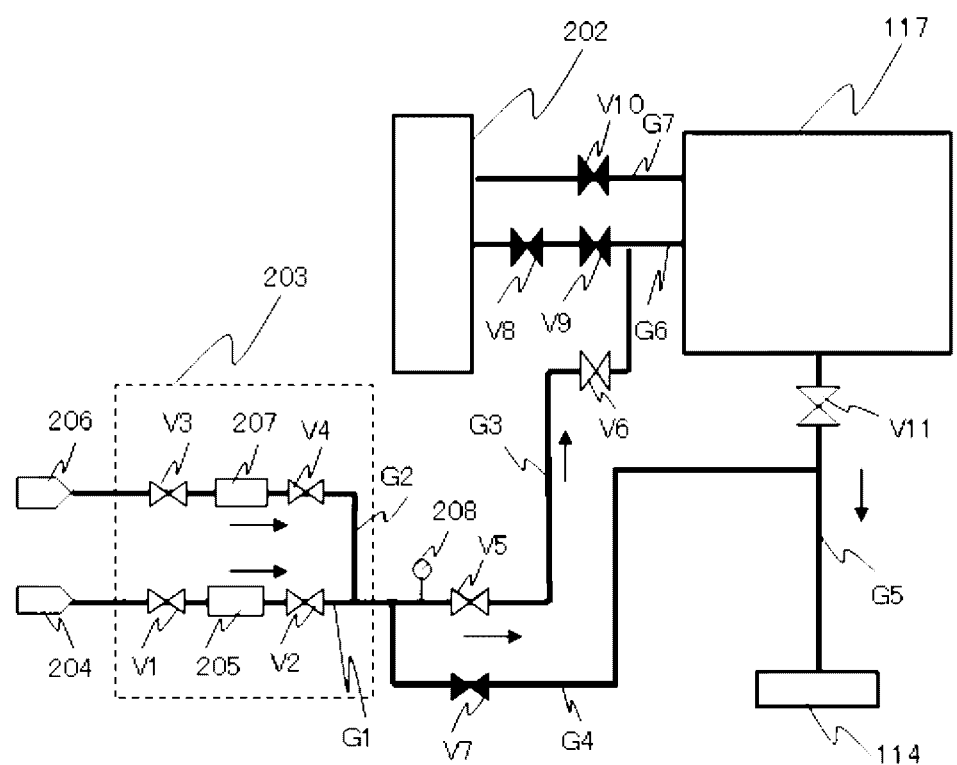

[FIG. 7]
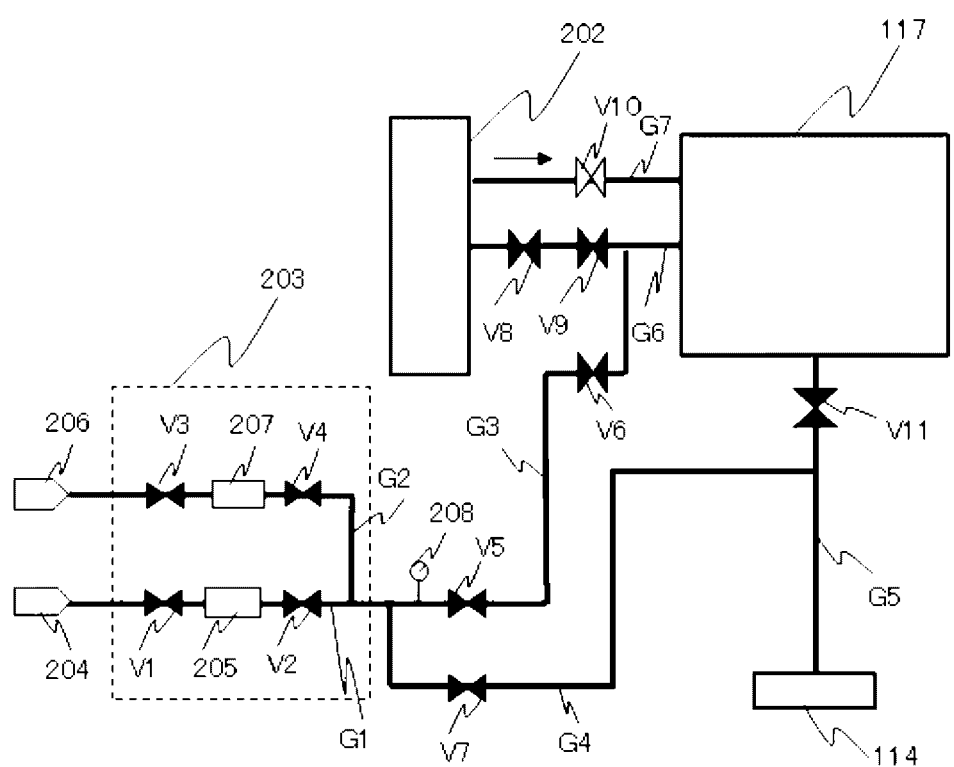

[FIG. 8]
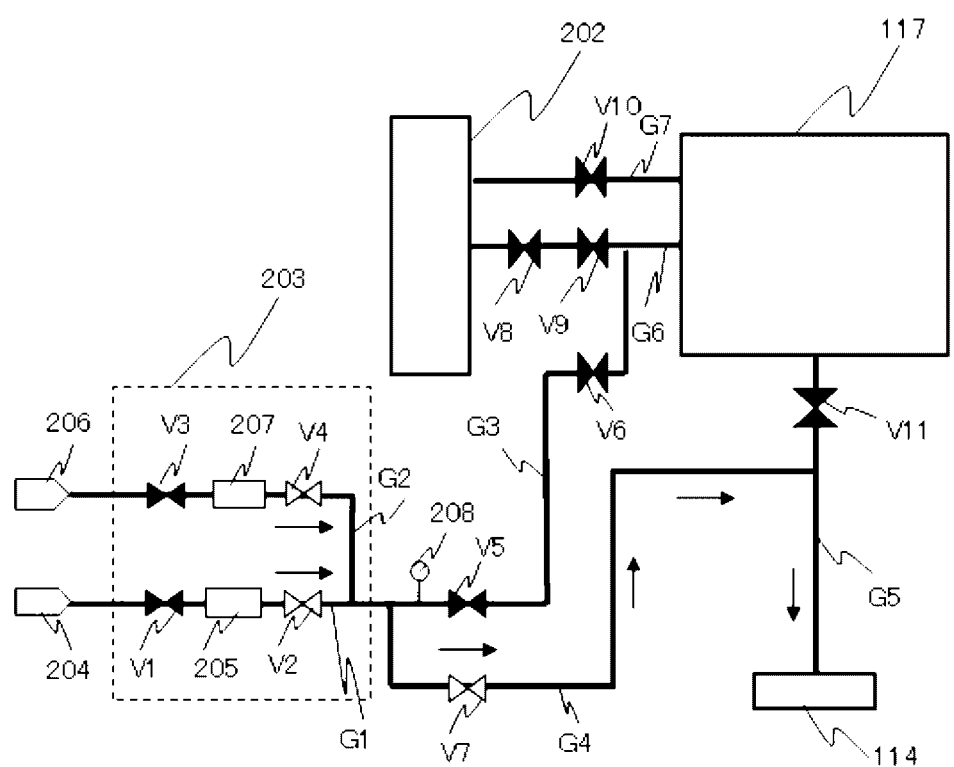

PLASMA PROCESSING APPARATUS AND PLASMA PROCESSING METHOD

TECHNICAL FIELD

The present invention relates to a plasma processing apparatus or a plasma processing method that manufactures a semiconductor device by processing a substrate-shaped sample, such as a semiconductor wafer, arranged inside a container with plasma formed using processing gas supplied into a processing chamber, and particularly relates to a plasma processing apparatus or a plasma processing method that processes a sample using supplied processing gas, which is obtained by vaporizing a liquid serving as a raw material.

BACKGROUND ART

In recent years, devices become highly integrated, and machining techniques at an atomic layer level are required. As complexity, miniaturization, and aspect ratios of device structures increase year by year, CD dimension control and depth control of sparse and dense parts of structures having a high aspect ratio have become key techniques.

In the related art, in order to control density difference, plasma is generated in an etching chamber to perform etching and adjustment of deposited films, but a problem of poor coverage (step coverage) in a high aspect ratio pattern is apparent. In response to this problem, use of atomic layer deposition (hereinafter referred to as ALD), which enables film formation having good coverage, has been studied.

Precursor gas used as a raw material differs depending on a target film substance, but it is possible to form a film for one layer of atoms by periodically supplying the precursor gas together with carrier gas to a surface of a film-forming substrate in atomic units and physically adsorbing the precursor gas and the carrier gas on the surface of the substrate. It is known as one of effective methods capable of performing uniform and highly accurate film thickness control even in a high aspect ratio structure.

When the precursor gas used in ALD is, for example, bisdiethylaminosilane (BDEAS), since BDEAS is close to ammonia in properties, it is necessary to avoid mixing BDEAS with combustion supporting gas. Therefore, in a vacuum processing apparatus equipped with an ALD mechanism capable of uniform film formation, it is necessary to provide a gas supply unit including a hard interlock of a gas valve in consideration of safety.

For example, JP-A-2019-110215 (PTL 1) in the related art is known as such a technique. This related art discloses a plasma processing apparatus that processes a semiconductor wafer arranged in a processing chamber, which is arranged inside a vacuum container, using plasma formed in the processing chamber, the plasma processing apparatus including a first gas supply line through which first gas used for plasma generation flows passing through a shower plate arranged on an upper portion of the processing chamber, and a second gas supply line arranged inside the processing chamber that supplies second gas used for plasma generation without passing through the shower plate, in which a third gas supply line through which precursor gas having a deposition property flows is connected to the second gas supply line. This related art further discloses a technique in which a valve that can be closed is arranged on the second gas supply line such that the precursor gas does not flow to an upstream side of the second gas supply line, so as to stably supply processing gas and the precursor gas to the processing chamber by opening and closing the valve as appropriate.

CITATION LIST

Patent Literature

PTL 1: JP-A-2019-110215

SUMMARY OF INVENTION

Technical Problem

However, the technique in the related art has a problem since the following points are not sufficiently taken into consideration.

That is, the atomic layer deposition (ALD) process in the related art has a step of forming a molecular layer by physical adsorption on surfaces of the semiconductor wafer and a member arranged inside the processing chamber by supplying the precursor gas for forming adsorbed species having a deposition property into the processing chamber. However, in this related art, among processing steps of supplying the precursor gas, there is a phenomenon that the precursor gas staying in the gas line that supplies the precursor gas from a precursor gas supply unit into the vacuum processing apparatus adheres to an inner surface of the gas line.

Since the precursor gas is highly reactive gas generated by vaporizing from the liquid that is the raw material, there is a problem that gas particles that remain adhering to the gas line for supplying are liquefied from a steam state and then cause a chemical reaction with a material of a surface of a member constituting the gas line, and a product produced by the chemical reaction is supplied together with the precursor gas to the processing chamber in steps after supplying the precursor gas to the processing chamber, and then become particles adhering to the wafer, thereby impairing processing yields.

An object of the invention is to provide a plasma processing apparatus or a plasma processing method having an improved yield.

Solution to Problem

The object is achieved by a plasma processing apparatus including: a processing chamber arranged inside a vacuum container, in which a wafer to be processed is arranged; a processing gas supply line connecting to the vacuum container, communicating with the processing chamber, and configured to supply processing gas having adhesiveness to the processing chamber; and a gas exhaust line for the processing gas connecting and communicating the processing gas supply line with a processing chamber exhaust line that is connected to an exhaust pump and communicates with the processing chamber, in which the plasma processing apparatus has a function of performing a step of exhausting the processing gas in the processing gas supply line through the gas exhaust line and the processing chamber exhaust line in a state where supplying of the processing gas to the processing chamber is stopped between one processing step of etching the wafer and a subsequent processing step.

The object is also achieved by a plasma processing method including: an etching processing step of arranging a wafer to be processed inside a processing chamber arranged inside a vacuum container, and supplying etching gas into the processing chamber to process the wafer; a film forming step of supplying a film forming gas having adhesiveness into the processing chamber to form a film on the wafer after the etching processing step, the film forming gas flowing through a film forming gas supply line connected to the vacuum container and which communicates with the processing chamber; and an exhausting step of exhausting a gas in the film forming gas supply line through a film forming gas exhaust line which is connected and communicates with a processing chamber exhaust line disposed between one etching processing step and a subsequent etching processing step. The processing chamber exhaust line is arranged to communicate an exhaust pump with the processing chamber, and the exhausting step further comprises exhausting the gas in the film forming gas supply line through a connecting portion of the film forming gas supply line and the film forming gas exhaust line in a state in which the film forming gas supply line is closed at an upstream location and a downstream location with respect to the connecting portion.

Advantageous Effect

According to the invention, a plasma processing apparatus or a plasma processing method having an improved yield can be provided.

BRIEF DESCRIPTION OF DRAWINGS

FIG. 1 is a longitudinal sectional diagram showing an outline of an overall configuration of a plasma processing apparatus according to an embodiment of the invention.

FIG. 2 is an enlarged diagram schematically showing a configuration of a gas supply unit according to the embodiment shown in FIG. 1.

FIG. 3 is a time chart showing an example of an operation flow during processing of a semiconductor wafer performed by the plasma processing apparatus according to the embodiment shown in FIG. 1.

FIG. 4 is a diagram schematically showing a state of the plasma processing apparatus according to the embodiment shown in FIG. 1 during a step of high vacuum exhausting before processing shown in FIG. 3.

FIG. 5 is a diagram schematically showing a state of the plasma processing apparatus according to the embodiment shown in FIG. 1 during a step of etching processing shown in FIG. 3.

FIG. 6 is a diagram schematically showing a state of the plasma processing apparatus according to the embodiment shown in FIG. 1 during a step of atomic layer deposition (ALD) shown in FIG. 3.

FIG. 7 is a diagram schematically showing a state of the plasma processing apparatus according to the embodiment shown in FIG. 1 during a step of Ox discharging shown in FIG. 3.

FIG. 8 is a diagram schematically showing a state of the plasma processing apparatus according to the embodiment shown in FIG. 1 during a step of roughing exhausting after processing shown in FIG. 3.

DESCRIPTION OF EMBODIMENTS

Hereinafter, an embodiment of the invention will be described with reference to the drawings.

Embodiment 1

An embodiment of the invention will be described with reference to FIGS. 1 to 8.

FIG. 1 is a longitudinal sectional diagram schematically showing an outline of an overall configuration of a plasma processing apparatus according to the embodiment of the invention.

A plasma processing apparatus 100 according to the embodiment shown in FIG. 1 is roughly divided into an electromagnetic wave supply unit 101, a vacuum processing unit 102, an exhaust unit 103, and a gas supply unit 104. The electromagnetic wave supply unit 101 is a unit that forms an electric field and a magnetic field and causes the electric field and the magnetic field to interact with each other by electron cyclotron resonance (ECR), which is a specific resonance between the electric field and the magnetic field, to generate plasma. The vacuum processing unit 102 is a unit that etches a sample such as a wafer with plasma and specific gas under a decompressed pressure. The exhaust unit 103 is a unit that decompresses and exhausts an inside of the vacuum processing unit 102. The gas supply unit 104 is a unit that supplies gas to the vacuum processing unit 102 for etching a sample arranged in the vacuum processing unit 102.

The vacuum processing unit 102 of the plasma processing apparatus 100 according to the present embodiment includes a vacuum container 109 having a cylindrical shape, and a processing chamber is provided inside the vacuum container, which is a space in which a substrate-shaped sample such as a semiconductor wafer 112 is arranged and plasma is formed. The plasma processing apparatus 100 according to the present embodiment uses a microwave electric field as an electric field supplied to the processing chamber to generate plasma in the processing chamber, and then excites and ionizes or dissociates particles such as atoms or molecules of processing gas supplied to the processing chamber to generate plasma. A film structure, including a mask formed in advance on an upper surface of the substrate-shaped sample such as the semiconductor wafer 112 arranged in the processing chamber and a film layer to be processed, is etched using the plasma.

An inside of the vacuum container 109 of the plasma processing apparatus 100 according to the present embodiment includes a vacuum processing chamber 117 which is a space that can be decompressed and in which the semiconductor wafer 112 is arranged and plasma is formed. In the plasma processing apparatus 100, below a bottom surface of the vacuum container 109, a vacuum exhaust device 114 provided with a roughing pump such as a turbo molecular pump or a rotary pump that exhausts and decompresses an inside of the vacuum processing chamber 117 is communicated with and connected to the inside of the vacuum processing chamber 117 via a processing chamber exhaust line G5. A pressure control valve V11 that increases or decreases a cross-sectional area of a flow path, through which particles of gas from the vacuum processing chamber 117 or the like flow, inside the processing chamber exhaust line G5 to adjust a flow rate or a velocity of the particles is provided on the processing chamber exhaust line G5. The inside of the vacuum container 109 is provided with a first gas supply unit 110 that supplies first gas for generating plasma into the vacuum processing chamber 117, a second gas supply unit 111 that supplies second gas into the vacuum container109, and a stage 113 which is a sample table arranged inside the vacuum processing chamber 117, and the semiconductor wafer 112 as a sample being arranged on an upper surface thereof.

The first gas supply unit 110 is arranged so as to face a gap between a disk-shaped dielectric shower plate 108 that constitutes a top surface of the vacuum processing chamber 117 and is arranged so as to face the upper surface of the stage 113, and a disk-shaped dielectric window 107 that constitutes a lid member of the vacuum container 109 and airtightly seals inside and outside thereof. The first gas introduced from the first gas supply unit 110 into the gap diffuses inside the gap and flows through holes 118 in a center portion of the shower plate 108 into the vacuum processing chamber 117 from above. The second gas supply unit 111 is arranged on an cylindrical inner side wall of the vacuum container 109 facing the inside of the vacuum processing chamber 117 below the shower plate 108, and introduces the second gas into the vacuum processing chamber 117 in parallel with the shower plate 108.

The first gas for generating plasma to be supplied to the vacuum processing chamber 117 passes a processing gas supply line G7 connected to a processing gas supply system 202, and is supplied from an opening at a tip portion of the first gas supply unit 110 to the gap between the shower plate 108 and the dielectric window 107. In addition, the first gas is dispersed and introduced from a plurality of through holes 118 of the shower plate 108, so that uniformity of distribution of the plasma formed inside the vacuum processing chamber 117 and distribution of a flow rate of the first gas in an in-plane direction of the semiconductor wafer 112 is improved, and variations in etching velocities and rates at which products are deposited between a center and an outermost periphery of the semiconductor wafer 112 are reduced.

Similarly, the second gas for generating plasma passes a processing gas supply line G6 connected to a precursor gas supply system 203, and is supplied from an opening at a tip portion of the second gas supply unit 111 arranged on a member constituting an inner side wall surface of the vacuum processing chamber 117 below the shower plate 108 into the vacuum processing chamber 117. Types and compositions of the first gas and the second gas differ depending on a type of a material for a film layer to be processed formed on the wafer 112 and a target processing shape thereof.

A pressure in the vacuum processing chamber 117 is adjusted by a balance between a flow rate or velocity of the first gas or the second gas supplied and a flow rate or velocity of exhausting by the vacuum exhaust device 114 via the pressure control valve V11. Such pressure adjustment is performed by the processing gas supply system 202 and the precursor gas supply system 203 that receive a command signal from a control device 121 via a communication device (not shown) and operations of a plurality of valves on the processing gas supply lines G6 and G7 that connect the processing gas supply system 202 and the precursor gas supply system 203 with the vacuum processing chamber 117 respectively. For example, by increasing or decreasing an opening degree of the pressure control valve V11 according to a command signal from the control device 121, the pressure in the vacuum processing chamber 117 is adjusted to a value within a desired range suitable for generating plasma. According to the present embodiment, a pressure of about 0.1 to 100 Pa suitable for an etching processing under which charged particles such as ions are incident on an upper surface of the wafer 112 with improved anisotropy is used.

The plasma processing apparatus 100 is provided with an electric field generation unit 105 such as a magnetron that forms a microwave electric field to generate plasma supplied into the vacuum processing chamber 117, and a radio frequency power source 116 that is connected to an electrode (not shown) arranged inside the stage 113 via a matching device 115, and supplies radio frequency power to form a bias potential on the wafer 112 to attract charged particles such as ions in the plasma to the upper surface of the wafer 112 and make charged particles incident. The electric field generation unit 105 is arranged above the dielectric window 107, and is arranged at an end portion of a waveguide in which the formed radio frequency power propagates inward toward the vacuum processing chamber 117 below.

The electric field for generating plasma propagates downward through the waveguide, and then passes through the dielectric window 107 made of a material that transmits the electric field and the dielectric shower plate 108 below, so as to be supplied to the vacuum processing chamber 117. For the electric field according to the present embodiment, for example, a microwave having a frequency of 2.45 GHz is used, and the dielectric window 107 is made of a material that transmits microwaves such as quartz. A solenoid coil 106 constituting the electromagnetic wave supply unit 101 and to which direct current is supplied is arranged above the dielectric window 107 on an upper portion of the vacuum container 109 according to the present embodiment and around the side wall of the vacuum container 109, so as to form a magnetic field that forms an electron cyclotron resonance in the vacuum processing chamber 117 in a treatment plant. A magnetic field of 875 G, which is a magnetic flux density required for an electron cyclotron resonance using the 2.45 GHz microwave according to the present embodiment, is formed.

In the vicinity of the magnetic field required for this electron cyclotron resonance, the microwave efficiently accelerates electrons to obtain high-energy electrons. Then, the high-energy electrons efficiently ionize molecules of etching gas, thereby efficiently producing plasma. Charged particles generated by the plasma are transported while being constrained by magnetic field lines of the magnetic field formed by the solenoid coil 106. The strength and distribution of the magnetic field is adjusted according to a command signal from the control device 121 received via a communication device (not shown), so that distribution of ion flux to the wafer 112 is adjusted to give a desired etching processing result.

Next, a configuration of the gas supply unit 104 according to the present embodiment will be described with reference to FIG. 2 in addition to FIG. 1. FIG. 2 is an enlarged diagram schematically showing the configuration of the gas supply unit according to the embodiment shown in FIG. 1.

An inside of the gas supply unit 104 according to the present embodiment is provided with the processing gas supply system 202 and the precursor gas supply system 203. The processing gas supply system 202 and the precursor gas supply system 203 are connected to the vacuum processing chamber 117 via the processing gas supply line G7 and the processing gas supply line G6, respectively. On the processing gas supply line G7, a valve V10 that opens and closes an inside of the processing gas supply line G7 and adjusts a gas flow passing through the processing gas supply line G7 is arranged, and similarly, on the processing gas supply line G6, a valve V8 and a valve V9 that open and close to adjust a gas flow are arranged.

The precursor gas supply system 203 is connected to the processing gas supply line G6 via a precursor gas and inert gas supply line G3. Precursor gas or inert gas supplied from the precursor gas supply system 203 is supplied to the processing gas supply line G6 through the precursor gas and inert gas supply line G3, and is supplied from the second gas supply unit 111 into the vacuum processing chamber 117.

The precursor gas supply system 203 includes a precursor gas supply line G1 through which the precursor gas flows and an inert gas supply line G2 through which the inert gas flows, and these gas lines merge so as to be connected to the precursor gas and inert gas supply line G3. A precursor gas supply unit 204, which is a gas source, and a precursor gas flow rate regulator 205 are arranged on the precursor gas supply line G1. A valve V1 is arranged between the precursor gas supply unit 204 and the precursor gas flow rate regulator 205, and a valve V2 is arranged between a merging section of the precursor gas supply line G1 and the inert gas supply line G2 and the precursor gas flow rate regulator 205. The valves V1 and V2 open and close an inside of the precursor gas supply line G1 to regulate a gas flow.

On the inert gas supply line G2, an inert gas supply unit 206, which is a gas source, and an inert gas flow rate regulator 207 are arranged. A valve V3 is arranged between the inert gas supply unit 206 and the inert gas flow rate regulator 207, and a valve V4 is arranged between the merging section of the precursor gas supply line G1 and the inert gas supply line G2 and the inert gas flow rate regulator 207. A flow rate or velocity of supplying of the precursor gas from the precursor gas supply unit 204 is adjusted by the precursor gas flow rate regulator 205, and opening and closing of the precursor gas supply line G1 are adjusted by the valves V1 and V2. A flow rate or velocity of supplying of the inert gas from the inert gas supply unit 206 is adjusted by the inert gas flow rate regulator 207, and opening and closing of the inert gas supply line G2 are adjusted by the valves V3 and V4. The precursor gas supply line G1 and the inert gas supply line G2 are connected and merged from the valves V2 and V4 on a processing chamber side.

The precursor gas and inert gas supply line G3 is a gas supply path that connects from the merging section of the precursor gas supply line G1 and the inert gas supply line G2 in the precursor gas supply system 203 to a predetermined location between a valve V9 on the processing gas supply line G6 and the second gas supply unit 111, and that supplies the precursor gas or the inert gas from the processing gas supply line G6 into the vacuum processing chamber 117, on which a pressure gauge 208 and valves V5 and V6 are arranged in this order from the merging section. This pressure gauge 208 is used to regulate a gas flow of a precursor gas and inert gas exhaust line G4. By closing the valves V5 and V6, gas from the processing gas supply line G6 is prevented from flowing into the precursor gas supply system 203 or the precursor gas supply line G1 and the inert gas supply line G2 through which the inert gas flows.

The precursor gas and inert gas exhaust line G4 is a gas path that connects the precursor gas and inert gas supply line G3 with the processing chamber exhaust line G5, and is connected to a location on the processing chamber exhaust line G5 between the valve V11 and a vacuum exhaust device114, on which a valve V7 is arranged so as to open and close this path. When supplying of gas from the precursor gas supply system 203 to the processing gas supply line G6 is stopped, precursor gas remaining in the precursor gas supply line G1, the inert gas supply line G2, and the precursor gas and inert gas supply line G3 between the valves V2 and V5 as well as between the valves V4 and V5, passes through the precursor gas and inert gas exhaust line G4 on which the valve 7 is opened and then is exhausted to the processing chamber exhaust lineG5. The vacuum exhaust device 114 also has an effect of exhausting precursor gas remained as steam.

Next, opening and closing of a plurality of valves and a gas flow on each gas line during processing of a film to be processed, which is formed in advance on the surface of the semiconductor wafer 112, that is performed by the plasma processing apparatus 100 according to the present embodiment will be described with reference to FIGS. 3 to 8. FIG. 3 is a time chart showing an example of an operation flow during processing of a semiconductor wafer performed by the plasma processing apparatus according to the embodiment shown in FIG. 1.

According to the present embodiment, in processing of the semiconductor wafer 112, after the semiconductor wafer 112 is carried into the vacuum processing chamber 117 and held on the stage 113, steps are performed in an order of high vacuum exhausting before processing (see FIG. 5), then etching processing (see FIG. 5), ALD (see FIG. 6), and Ox discharging (a step of generating plasma using oxygen gas, see FIG. 7), and then the etching processing (see FIG. 4) is performed again. According to the present embodiment, these steps performed in the above-mentioned order are regarded as one cycle, and after repeating the cycle a plurality of times, roughing exhausting after processing (see FIG. 8) is performed. Then, the semiconductor wafer 112 is carried out from the vacuum processing chamber 117.

In FIG. 3, in order to achieve required gas and pressure in the vacuum processing chamber 117in each of the above steps, opening and closing of the plurality of valves V1 to V11 and presence or absence of a gas flow in each of the gas lines G1 to G7 are indicated by solid lines indicating on and off. Although only the gas flow in each of the gas lines is shown, a flow rate or velocity of the gas flow is adjusted to a value in a range suitable for the processing step according to a command signal from the control device 121 by flow regulators arranged on one or a plurality of connected and communicated gas lines.

Start and stop of the gas flow in the plurality of gas lines by opening and closing the plurality of valves, selection of a path where gas flows by these operations, or adjustment of the flow rate or velocity of gas by adjusting an opening degree of the valve shown in FIGS. 3 to 8 of the present embodiment is performed according to a command signal from the control device 121.

FIGS. 4 to 8 describe gas flows in the exhaust unit and the gas supply unit 104 connected to the vacuum processing chamber 117, and opening and closing states of a plurality of valves on a plurality of gas lines connecting the exhaust unit, the gas supply unit 104, and the vacuum processing chamber 117 in a step of high vacuum exhausting before processing shown in FIG. 3. FIG. 4 is a diagram schematically showing a state of the plasma processing apparatus according to the embodiment shown in FIG. 1 during the step of high vacuum exhausting before processing shown in FIG. 3.

As shown in FIG. 4, in the step of high vacuum exhausting before processing, the valves V1 and V2 on the precursor gas supply line G1 and the valves V3 and V4 on the inert gas supply line G2 in the precursor gas supply system 203, and the valve V7 on the precursor gas and inert gas exhaust line G4 are closed, so that the gas flows in these gas lines are stopped, and the flow of the precursor gas or the inert gas from the precursor gas supply system 203 to the vacuum processing chamber 117 and the processing chamber exhaust line G5 is maintained to be stopped. At the same time, the valves V5 and V6 on the precursor gas and inert gas supply line G3, the valves V8 to V10 on the processing gas supply lines G6 and G7, and the valve 11 on the processing chamber exhaust line G5 are maintained to be opened. In this state, the vacuum exhaust device 114 is driven according to a command signal from the control device 121, and the valve 11 is set to a maximum opening degree.

Therefore, the processing gas from the processing gas supply system 202 of the plasma processing apparatus 100 is supplied to the vacuum processing chamber 117 through the processing gas supply lines G6 and G7, and then the processing gas is exhausted through the processing chamber exhaust line G5 while the pressure in the vacuum processing chamber 117 is reduced to a higher degree of vacuum than that during a step of etching processing of the semiconductor wafer 112. For example, up to a pressure of 0.7 Pa (approximately 5.0 mm Torr) or less, in this step, the gas in the precursor gas and inert gas supply line G3 and each line between the merging section of the precursor gas supply line G1 and the inert gas supply line G2 and the valves V2 and V4 is also exhausted from the processing gas supply line G6 through the processing chamber exhaust line G5 via the vacuum processing chamber 117.

In FIGS. 4 to 8, as for the state of each valve, a state of "opened" or "on" at a predetermined opening degree is indicated by a black filling, and a state of "off" or "airtightly closed" is shown in a white space. When the valve is "on" or "opened" so that gas flows through each gas line, a gas flow and a direction thereof is indicated by an arrow.

FIG. 5 is a diagram schematically showing a state of the plasma processing apparatus according to the embodiment shown in FIG. 1 during a step of etching processing shown in FIG. 3.

As shown in FIG. 5, in the step of etching processing, the valves V1 and V2 on the precursor gas supply line G1 and the valves V3 and V4 on the inert gas supply line G2 in the precursor gas supply system 203, and the valve V7 on the precursor gas and inert gas exhaust line G4 are kept closed since the step of high vacuum exhausting before processing, and the gas flows in these gas lines are still stopped. The valves V5 and V6 on the precursor gas and inert gas supply line G3 are closed, and the flow of the precursor gas or the inert gas from the precursor gas supply system 203 to the precursor gas and inert gas supply line G3 and the processing chamber exhaust line G5 is maintained to be stopped.

Meanwhile, the valves V8 to V10 on the processing gas supply lines G6 and G1are opened, and the processing gas is supplied into the vacuum processing chamber 117 through these processing gas supply lines G6 and G7 during the step of etching processing. During this step as well as during the step of high vacuum exhausting before processing, particles such as gas and products in the vacuum processing chamber 112 are exhausted to an outside of the chamber through the processing chamber exhaust line G4. By balancing a flow rate or velocity of the processing gas from the first and second gas supply units connected to and communicated with the processing gas supply lines G6 and G1and a flow rate or velocity of gas exhausted through the processing chamber exhaust line G5, which is adjusted by driving of the vacuum exhaust device 114 and an opening degree of the valve 11, a pressure inside the vacuum processing chamber 117 is set to a value within a range suitable for conditions of the etching processing of the film layer to be processed on the upper surface of the semiconductor wafer 112. According to the present embodiment, the pressure is set to a value within a range of 0.7 to 4 Pa for example.

In this state, plasma is generated in the vacuum processing chamber 117 using the processing gas by an interaction with the electric field or the magnetic field supplied from the electromagnetic wave supply unit 101. The film layer to be processed on the upper surface of the semiconductor wafer 112 is etched using the generated plasma. During the etching processing, the valve 11 has an opening degree corresponding to a command signal from the control device 121 and is maintained in an on state; the particles are still exhausted from the inside of the vacuum processing chamber 117 through the processing chamber exhaust line G5; and the pressure inside the vacuum processing chamber 117 is maintained within a range suitable for the processing.

The etching process according to the present embodiment is continued until the control device 121, which receives an output from a remaining film thickness detector or an etching end point determination device (not shown), determines that a target remaining thickness or an end point is reached, and ends when the control device 121 determines that the target remaining thickness or the end point is reached. In the step of etching processing according to the present embodiment, the radio frequency power is supplied from the radio frequency power source 116 to the electrode arranged inside the stage 113, so that an bias potential is formed on the upper surface of the semiconductor wafer 112 according to a potential difference from the plasma formed in the vacuum processing chamber 117. The charged particles such as ions in the plasma are attracted to the film layer to be processed on the upper surface of the semiconductor wafer 112 and collide with an upper surface of the film layer to be processed, which is not covered by a mask layer including a bottom surface provided with grooves and holes. Ion collision energy in this case is used to perform anisotropic etching along a direction of the electric field based on the potential difference.

FIG. 6 is a diagram schematically showing a state of the plasma processing apparatus according to the embodiment shown in FIG. 1 during a step of atomic layer deposition (ALD) shown in FIG. 3. In the ALD step according to the present embodiment, by supplying gas having a deposition property into the vacuum processing chamber 117 while the semiconductor wafer 112 is held on the stage 113 in the vacuum processing chamber 117, in the step of etching processing shown in FIG. 5, particles of the gas adhere to the upper surface of the semiconductor wafer 112, which is processed to form a shape including grooves and holes.

As shown in FIG. 6, in the ALD step, the valves V1 and V2 on the precursor gas supply line G1 and the valves V3 and V4 on the inert gas supply line G2 in the precursor gas supply system 203, and the valves V5 and V6 on the precursor gas and inert gas exhaust line G3 are opened, so that the precursor gas or the inert gas passes through the precursor gas and inert gas supply line G3 and is supplied into the vacuum processing chamber 117 through the processing gas supply line G6. Meanwhile, the valves V8 to V10 on the processing gas supply lines G6 and G7 are airtightly closed, so that flows of the processing gas from the processing gas supply system 202 through these gas lines are stopped. The valve V7 on the precursor gas and inert gas exhaust line G4 is maintained to be closed, and a state is maintained in which the precursor gas or the inert gas from the precursor gas supply system 203 is stopped from flowing through the precursor gas and inert gas supply line G3 or to the processing chamber exhaust line G5.

The precursor gas used for the ALD step according to the present embodiment is, for example, any one of or a combination of a plurality of bis(diethylamino)silane (BDEAS or SAM24), tetrakis(dimethylamino)silane (4DMAS), tris(dimethylamino)silane (3DMAS), bis(dimethylamino)silane (2DMAS), tetrakis(ethylmethylamino)silane (4EMAS), tris(ethylmethylamino)silane (3EMAS), bis(tertiarybutylamino)silane (BTBAS), and bis(ethylmethylamino)silane (BEMAS) at a predetermined flow rate, quantity, or pressure ratio with respect to a SiO film to be processed (a film made of silicon oxide such as $SiO_2$). Adhering of the precursor gas particles is performed until the particles adhering to the surface of the film to be processed are deposited to a target thickness preferable for the processing. The deposited particles from the precursor gas may have a self-saturation property in which a velocity of deposition significantly decreases as the particles approach a predetermined thickness that is less than the preferable thickness.

According to the present embodiment, in this case, the ALD step is repeated a plurality of times with a step of Ox discharging described below to deposit the particles to the target thickness. One ALD step ends until the control device 121 that receives the output from the film thickness detector (not shown) detects that the predetermined thickness determined by the self-saturation property is reached, or is performed for a predetermined time, by which the predetermined thickness is previously confirmed to be reached.

During the ALD step, the vacuum exhaust device 114 is driven and the opening degree of the valve V11 is adjusted so that the pressure in the vacuum processing chamber 117 is maintained at a value within a range suitable for the ALD step. According to the embodiment, the pressure is set to 1.0 Pa (approximately 7.5 mm Torr) for example.

FIG. 7 is a diagram schematically showing a state of the plasma processing apparatus according to the embodiment shown in FIG. 1 during a step of Ox discharging shown in FIG. 3. In the step of Ox discharging according to the present embodiment, the oxygen gas (Ox gas, in which x is a natural number of 1 or more) is supplied into the vacuum processing chamber 117 to generate the plasma using the electric field or the magnetic field from the electromagnetic wave supply unit 101, and the plasma interacts with the particles from the precursor gas adhering to and deposited on the surface of the film layer to be processed etched in the ALD step shown in FIG. 6, so as to physically or chemically alter and adsorb the particles as a protective film layer on the surface of the film.

As shown in FIG. 7, in the step of Ox discharging, the valves V1 to V9 on the precursor gas supply line G1 and the inert gas supply line G2 in the precursor gas supply system 203, the precursor gas and inert gas supply line G3, the processing gas supply line G6, and the processing chamber exhaust line G5 are airtightly closed, so that the gas flows in these gas lines are maintained to be stopped. Meanwhile, the valve 10 on the processing gas supply line G7 is opened, and the oxygen gas (Ox gas) from the processing gas supply system 202 is introduced into the vacuum processing chamber 117 via the through holes 118 of the shower plate 108 through the processing gas supply line G7 and the first gas supply unit 110.

The supplied Ox gas is excited by interaction with the electric field or the magnetic field from the electromagnetic wave supply unit 101, and is ionized or dissociated into plasma. Meanwhile, in this state, the valve V11 is opened at an opening degree according to a command signal from the control device 121, so that during the step of Ox discharging, the particles from the inside of the vacuum processing chamber 117 are maintained to be discharged through the processing chamber exhaust line G5. During the step of Ox discharging, by balancing supplying of the Ox gas from the first gas supply unit 110 and exhausting by the vacuum exhaust device 114 through the processing chamber exhaust line G5, the pressure in the vacuum processing chamber 117 is maintained at a value within a range suitable for the Ox discharging. According to the embodiment, the pressure is set to 0.7 Pa (approximately 5.0 mm Torr) for example.

The step of Ox discharging is preferably performed until the particles from the precursor gas deposited in the ALD step are physically or chemically altered and adsorbed as the protective film layer on the surface of the film. According to the embodiment, the step of Ox discharging is performed for a time by which all deposited layers of the particles from the precursor gas, which is detected to reach the predetermined thickness in the previous ALD step, are previously confirmed to be altered and adsorbed as the protective film layer.

When the control device 121 that receives the output from the film thickness detector detects that the thickness of the protective film layer does not reach the desired target thickness, or that the number of repetitions of the ALD step and the step of Ox discharging, which is previously confirmed to reach the target thickness, is not reached, the steps of the ALD and the Ox discharging are included in one set to be repeated again. Then, when the control device 121 detects that the thickness of the protective film layer reaches the target thickness, the step of Ox discharging is stopped.

According to the present embodiment, when the control device 121 that receives the output from the detector (not shown) detects that the shape of the grooves and holes formed after the processing which is obtained by the step of etching processing shown in FIG. 5 is not desirable, for example, an etching depth of the grooves and holes or the remaining thickness of the film layer to be processed is not desirable, one cycle, from the step of etching processing in FIG. 5 to at least one pair (set) of the ALD step and the step of Ox discharging in FIGS. 6 and 7, is repeated again. In the step of etching processing shown in FIG. 5 in any cycle except a first cycle, the protective film layer covering the bottom surface including the grooves and holes formed in a previous cycle is removed by the charged particles such as ions in the attracted and collided plasma, and the etching of the film layer to be processed below proceeds with anisotropy along the electric field of the bias potential generated by the radio frequency power from the radio frequency power source 116.

As described above, the plasma processing apparatus 100 according to the present embodiment performs at least once a set of processing steps including the plurality of sequentially performed steps shown in FIGS. 5 to 7 as one cycle. The step of high vacuum exhaust shown in FIG. 4 may also be performed between any cycle and a cycle immediately before or after it.

FIG. 8 is a diagram schematically showing a state of the plasma processing apparatus according to the embodiment shown in FIG. 1 during a step of roughing exhausting after processing shown in FIG. 3. After the set of processing steps including the plurality of sequentially performed steps shown in FIGS. 5 to 7 as one cycle is performed at least once, the step of roughing exhausting after processing according to the present embodiment is performed in which the gas in the precursor gas and inert gas supply line G3, the precursor gas supply line G1, and the inert gas supply line G2 is introduced into the processing chamber exhaust line G5 between the valve V11 and the vacuum exhaust device 114 through the precursor gas and inert gas exhaust line G4 and exhausted using the vacuum exhaust device 114. This step may be performed after processing on a film layer to be processed of any semiconductor wafer 112 is completed and the semiconductor wafer 112 is carried out of the vacuum processing chamber 117, from a time when a next semiconductor wafer 112 is placed and held on the stage 113 inside the vacuum processing chamber 117 until a first ALD step is started, or may be performed for each cycle of processing applied to one semiconductor wafer 112.

For example, in the step of etching processing shown in FIG. 5 of any cycle, when the control device 121 that receives the output from the detector (not shown) detects that the shape of the grooves and holes formed after the processing is not desirable, for example, the etching depth of the grooves and holes or the remaining thickness of the film layer to be processed is not desirable, the step of etching and the cycle of any time in which this step is included are ended. Then, as shown in FIG. 8, the gas lines in the precursor gas supply system and the processing chamber exhaust line G5 are connected and communicated with each other via the precursor gas and inert gas exhaust line G4, and gas remaining inside the communicated gas lines is exhausted.

That is, the valves V1, V3, V5, V6 and V8 to V10 are airtightly closed, and the valve V11 is also closed, so that gas flows in the processing gas supply lines G1 and G2, the vacuum processing chamber 117, and a range from the valve V5 on the precursor gas and inert gas supply line G3 to the merging section with the processing gas supply line G6 is maintained to be stopped. Meanwhile, the valves V2, V4, and V7 are opened, and the precursor gas remaining inside a range from the valve V2 on the precursor gas supply line G1 to the merging section with the inert gas supply line G2, a range from the valve V4 on the inert gas supply line G2 to the merging section with the precursor gas supply line, and the precursor gas and inert gas supply line G3 between the merging section and the valve V5 flows into the precursor gas and inert gas exhaust line G4, and flows into the processing chamber exhaust line G5 together with the gas inside the gas lines and is then exhausted by the vacuum exhaust device 114 by driving the vacuum exhaust device 114.

In the vacuum exhaust device 114 according to the embodiment, a roughing pump such as a rotary pump is used instead of a turbo molecular pump in the step of roughing exhausting. Normally, the turbo molecular pump used for exhausting at a high degree of vacuum and the roughing pump for a relatively low degree of vacuum are communicated with and connected to each other in an order of an exhaust flow on an exhaust path from the vacuum processing chamber 117. In this embodiment, the precursor gas and inert gas supply line G3 in the step of roughing exhausting is connected to a location on the processing chamber exhaust line G5 between an outlet of the turbo molecular pump and an inlet of the roughing pump, and at least in this step, gas staying or flowing into the precursor gas and inert gas supply line G3 is exhausted to an outside through the processing chamber exhaust line G5 by the roughing pump.

In the step of roughing exhausting shown in FIG. 8, although a step is shown in which both the valves V5 and V6 on the precursor gas and inert gas supply line G3 are closed, gas inside a portion between the valves V5 and V6 on this gas line may also be exhausted through the precursor gas and inert gas exhaust line G4 by airtightly closing only the valve V6 and opening the valve V5.

Before starting this step, the processing gas supply lines G1 and G2 and the processing chamber exhaust line G5 may be maintained at a low pressure to supply gas therein into the vacuum processing chamber 117 in steps such as etching processing. In this case, when the valve V7 is opened for the roughing exhausting after processing as shown in FIG. 8, there is a risk of gas flowing back from the processing chamber exhaust line G5 having a relatively high pressure to the precursor gas supply line G1 and the inert gas supply line G2, or the precursor gas and inert gas supply line G3. According to the embodiment, in order to prevent the flowing back, in response to a command signal from the control device 121, the valves V3 and V4 are opened; the inert gas is supplied by the inert gas supply unit 206; and pressures inside the precursor gas supply line G1 and the inert gas supply line G2 are set to high pressures. The control device 121 detects the pressure inside the precursor gas and inert gas supply line G3 or the precursor gas supply line G1 and the inert gas supply line G2 communicated therewith using the pressure gauge 208, compares the detected pressure with the pressure in the processing chamber exhaust line G5, and opens the valve V7 after determining that the former pressure is higher. In this way, the flowing back is prevented.

As described above, in the step of roughing exhausting in which the etching processing is performed using precursor gas having a high deposition property such as BDEAS, before a next etching processing, an inside of a gas line through which the precursor gas passes is exhausted using the vacuum exhaust device 114. Therefore, it is possible to prevent a case in which gas particles and products formed by combining the particles with other substances are deposited inside a gas line, a gas flow is delayed or impeded, a desired gas flow rate or velocity is not reached during processing of a semiconductor wafer, and the processing yield is impaired. Such a step of roughing exhausting may be performed every time the above-mentioned one cycle is completed, or may be performed after the processing step on the film layer to be etched is completed and before the next ALD step is started. In any one of the cases, a pressure is adjusted before opening each valve, so as to prevent the gas and particles inside the processing chamber exhaust line G5 from flowing back to the precursor gas and inert gas supply line G3 or the precursor gas supply line G1 and the inert gas supply line G2 communicated therewith through the precursor gas and inert gas exhaust line G4.

The above-mentioned embodiment provides a plasma processing apparatus or a plasma processing method in which the precursor gas to be supplied to the lines among the processing steps is prevented from remaining in the precursor gas supply line G1, the inert gas supply line G2, the precursor gas and inert gas supply line G3, and the precursor gas and inert gas exhaust line G4, so that adverse effects due to deposition of the precursor gas particles and compounds thereof can be reduced, and the yield can be improved.

REFERENCE SIGN LIST

100: plasma processing apparatus
101: electromagnetic wave supply unit
102: vacuum processing unit
103: exhaust unit
104: gas supply unit
105: electric field generation unit
106: solenoid coil
107: dielectric window
108: shower plate
109: vacuum container
110: first gas supply unit
111: second gas supply unit
112: semiconductor wafer
113: stage
114: vacuum exhaust device
115: matching device
116: radio frequency power source
117: vacuum processing chamber
118: through hole
119: first gas flow
120: second gas flow
121: control device
202: processing gas supply system 203: precursor gas supply system
204: precursor gas supply unit
205: precursor gas flow rate regulator
206: inert gas supply unit
207: inert gas flow rate regulator
208: pressure gauge
209: vacuum exhaust device
G1: precursor gas supply line
G2: inert gas supply line
G3: precursor gas and inert gas supply line
G4: precursor gas and inert gas exhaust line
G5: processing chamber exhaust line
G6: processing gas supply line
G7: processing gas supply line

The invention claimed is:

1. A plasma processing method, comprising:
an etching processing step of arranging a wafer to be processed inside a processing chamber arranged inside a vacuum container, and supplying etching gas into the processing chamber to process the wafer;
a film forming step of supplying a film forming gas having adhesiveness into the processing chamber to form a film on the wafer after the etching processing step, the film forming gas flowing through a film forming gas supply line connected to the vacuum container and which communicates with the processing chamber; and
an exhausting step of exhausting a gas in the film forming gas supply line through a film forming gas exhaust line which is connected and communicates with a processing chamber exhaust line disposed between one etching processing step and a subsequent etching processing step,
wherein the processing chamber exhaust line is arranged to communicate an exhaust pump with the processing chamber, and
wherein the exhausting step further comprises exhausting the gas in the film forming gas supply line through a connecting portion of the film forming gas supply line and the film forming gas exhaust line in a state in which the film forming gas supply line is closed at an upstream location and a downstream location with respect to the connecting portion.

2. The plasma processing method according to claim 1, wherein
a plurality of steps including the film forming step after the etching processing step are regarded as one cycle, and the cycle is performed at least once on the wafer arranged inside the processing chamber.

3. The plasma processing method according to claim 1, wherein
the film forming gas supply line includes a flow rate regulator for the film forming gas, a first valve arranged in the upstream location with respect to the connecting portion in which the film forming gas exhaust line is connected with the film forming gas supply line, and a second valve arranged between the connecting portion and the processing chamber and configured to open and close an inside of the film forming gas supply line,
the film forming gas exhaust line includes a third valve configured to open and close an inside thereof, and
the first valve and the second valve are closed and the third valve is opened in the exhausting step.

4. The plasma processing method according to claim 3, wherein
the exhausting step is performed in a state where a processing gas supply line for supplying the etching gas to the processing chamber is closed and exhausting from an inside of the processing chamber to the processing chamber exhaust line is stopped.

* * * * *